United States Patent [19]
Pirkle

[11] Patent Number: 5,915,190
[45] Date of Patent: Jun. 22, 1999

[54] METHODS FOR FILLING TRENCHES IN A SEMICONDUCTOR WAFER

[75] Inventor: David R. Pirkle, Soquel, Calif.

[73] Assignee: Lam Research Corporation, Fremont, Calif.

[21] Appl. No.: 08/902,656

[22] Filed: Jul. 30, 1997

Related U.S. Application Data

[63] Continuation of application No. 08/579,436, Dec. 27, 1995, abandoned.

[51] Int. Cl.⁶ .................................................. H01L 21/316
[52] U.S. Cl. ........................... 438/424; 438/695; 438/714; 438/788; 204/192.23
[58] Field of Search ...................... 204/192.23; 438/695, 438/714, 723, 729, 788, 789, 404, 424; 427/579

[56] References Cited

U.S. PATENT DOCUMENTS

| | | | |
|---|---|---|---|
| 4,401,054 | 8/1983 | Matsuo et al. | 118/723 |
| 4,476,622 | 10/1984 | Cogan | 437/62 |
| 4,681,653 | 7/1987 | Purdes | 156/643.1 |
| 4,732,761 | 3/1988 | Machida et al. | 437/228 |
| 4,839,306 | 6/1989 | Wakamatsu | 437/67 |
| 4,894,311 | 1/1990 | Uenishi et al. | 430/192 |
| 4,952,274 | 8/1990 | Abraham | 156/643.1 |
| 5,089,442 | 2/1992 | Olmer | 432/235 |
| 5,182,221 | 1/1993 | Sato | 437/67 |
| 5,252,520 | 10/1993 | Kocmanek et al. | 437/235 |
| 5,286,518 | 2/1994 | Cain et al. | 427/579 |
| 5,498,565 | 3/1996 | Gocho et al. | 437/67 |
| 5,562,952 | 10/1996 | Nakahigashi et al. | 427/534 |
| 5,679,606 | 10/1997 | Wang et al. | 437/195 |
| 5,753,564 | 5/1998 | Fukada | 437/238 |

FOREIGN PATENT DOCUMENTS

| | | | |
|---|---|---|---|
| WO 97/24761 | 7/1997 | European Pat. Off. | H01L 21/762 |
| 60249330 | 12/1995 | Japan | 437/62 |

OTHER PUBLICATIONS

Wolf, Stanley, *Silicon Processing for the VLSI Era*, vol. 2, Lattice Press, (No month 1990) pp. 194–196.

Wolf, Stanley & Richard Tauber, Silicon Processing for the VLSI Era, vol. 1, pp. xxii and 167 (1986) No month.

R.C. Jaeger, Chapter 2: "Isolation Technologies for Integrated Circuits," Introduction to Microelectronic Fabrication, 1988. No Month.

A, Bryant, W. Hansch and T. Mii, "Characteristics of CMOS Device Isolation for the ULSI Age," Siemens Components, Inc., 1994 IEEE. No Month.

S. Wolf, "A Review of IC Isolation Technologies—Parts 1–9," Solid State Technology, Mar. 1992–Jun. 1993.

S.M. Rossnagel, "Directional and preferential sputtering-–basedphysical vapor deposition," Thin Solid Films, vol. 263, No. 1, Jul. 1, 1995, pp. 1–12, IBM Research, Yorktown Heights, NY.

M. Gross and C.M. Horwitz, "Silicon dioxide trench filling process in a radio–frequency hollow cathode reactor," Journal of Vacuum Science and Technology, Part B, vol. 11, No. 2, Mar. 1, 1993, pp. 242–248, NY.

K. Machida and H. Oikawa, A High Aspect Ratio and High Throughput $SiO_2$ Planarization Technology with Bias–ECR Plasma Deposition, Symposium on VLSI Technology, May 18–21, 1987, No. SYMP. 7, May 18, 1987, Inst. Of Electrical Engineers, pp. 69–70, IEEE Electron Devices Society.

*Primary Examiner*—Chandra Chaudhari
*Assistant Examiner*—Matthew Whipple
*Attorney, Agent, or Firm*—Beyer & Weaver, LLP

[57] ABSTRACT

A method for filling a trench in a semiconductor wafer that is disposed in a plasma-enhanced chemical vapor deposition chamber. The method includes the step of depositing a protection layer of silicon dioxide over the wafer and into the trench while the wafer is biased at a first RF bias level. The protection layer has a thickness that is insufficient to completely fill the trench. Further, there is provided the step of forming a trench-fill layer of silicon dioxide over the protection layer and into the trench while the wafer is biased at a second RF bias level that is higher than the first bias level.

18 Claims, 8 Drawing Sheets

METHODS FOR FILLING TRENCHES IN A SEMICONDUCTOR WAFER

This is a continuation of application Ser. No. 08/579,436 filed Dec. 27, 1995 now abandoned.

BACKGROUND OF THE INVENTION

The present invention relates to integrated circuits. More particularly, the present invention relates to improved methods and apparatus for forming isolation barriers in integrated circuits.

Figure 1:
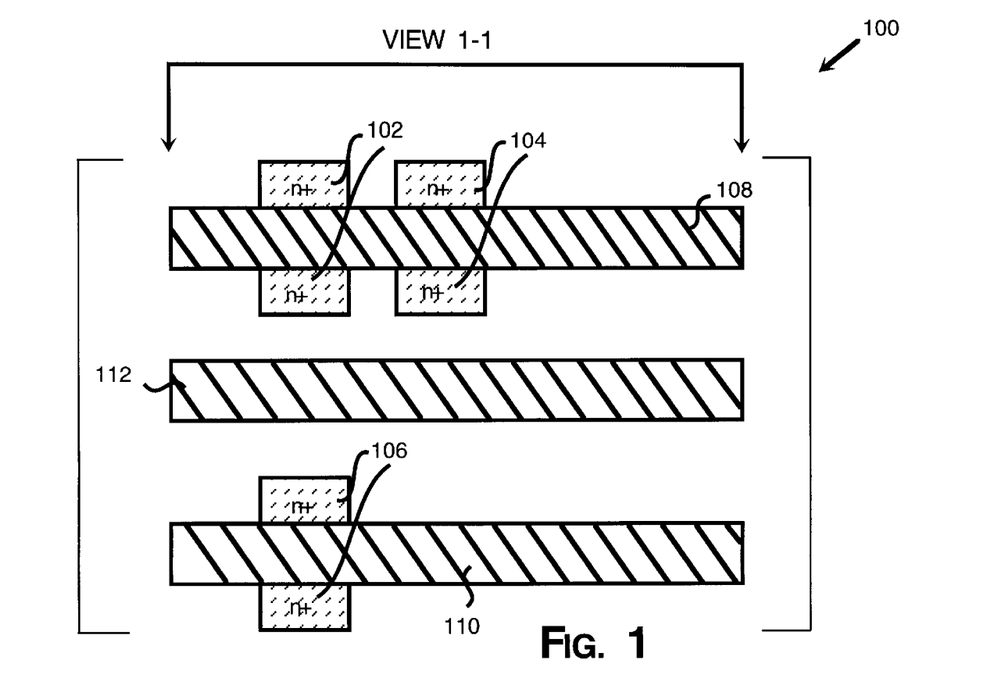
FIG. 1 shows a portion of a representative MOS IC circuit to facilitate discussion of isolation structures in modern IC's.

In a typical integrated circuit (IC), a large number of active devices such as transistors are provided on a semiconductor wafer, e.g., a silicon wafer. For MOS (metal oxide semiconductor) devices, the primary objective of the isolation barrier is to prevent parasitic current from flowing from the source of one device to the drain of an adjacent device. To illustrate, FIG. 1 shows a portion of a representative MOS IC circuit 100 comprising transistors 102, 104 and 106. Transistors 102 and 104 have in common a polysilicon gate 108 while transistor 106 is coupled to its own polysilicon gate 110. A polysilicon interconnect 112 is shown disposed between transistors 102 and 106.

Between transistors 102 and 104, there exists a conduction channel through which parasitic current may flow, thereby potentially forming an unwanted parasitic transistor. Likewise, the proximity of transistors 102 and 106 results in a conduction channel between these two transistors, undesirably creating another potential parasitic transistor. To prevent the formation of these parasitic transistors, isolation barriers between adjacent transistor pairs are preferably provided.

Figure 2:
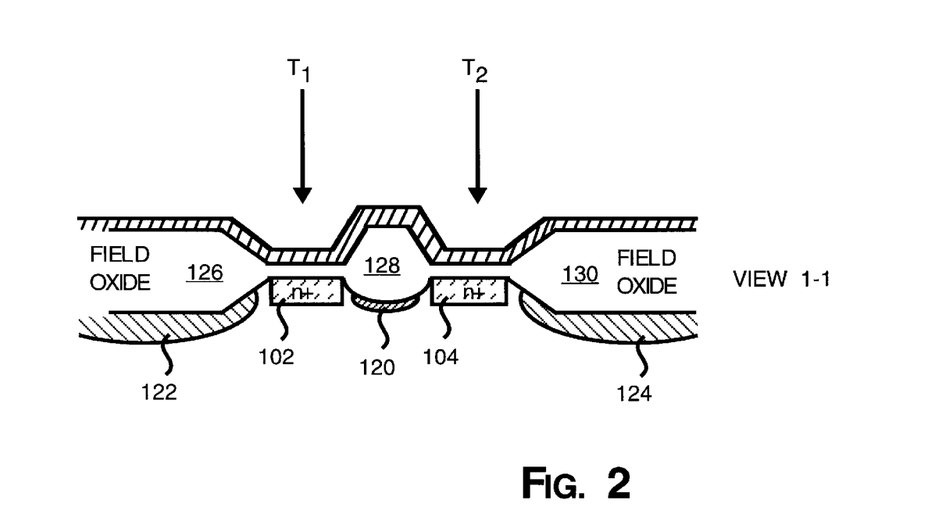
FIG. 2 shows an adjacent transistor pair, including isolation barriers to prevent the unwanted formation of parasitic transistors.

FIG. 2 shows one approach to providing isolation barriers between adjacent transistor pairs. In FIG. 2, the region between transistors 102 and 104 (shown as region 120) is preferably rendered relatively non-conductive to potential parasitic current flow by doping it with an appropriate dopant such as arsenic and phosphorous for N-channel devices, or boron for P-channel devices. Similarly, region 122 between transistor 102 and its adjacent transistors is likewise doped, as is region 124 between transistor 104 and its adjacent transistors.

The formation of unwanted conduction channels between adjacent transistors is further prevented by relatively thick silicon dioxide regions 126, 128, and 130. If the active devices are created in an epitaxial layer, e.g., in the case of bipolar devices, the silicon dioxide features, e.g., regions 126, 128, and 130, preferably extend into the substrate far enough to penetrate through the epitaxial layer.

Local oxidation of silicon (LOCOS) has proven in the past to be a cost-effective and efficient process for meeting these isolation requirements. LOCOS technology, being well known and extensively described in the literature, is familiar to those skilled in the art. In general, a typical LOCOS process involves growing a thin layer of thermal "pad" oxide, followed by the deposition of a silicon nitride thermal diffusion barrier. Openings in the nitride and oxide layers are then patterned and etched to expose the substrate, using a conventional photoresist process.

The exposed substrate regions are then doped via a conventional ion implantation technique to form "channel-stop" regions. As the term is used herein, a channel-stop region denotes a region of the substrate that has been rendered relatively non-conductive through doping or ion implantation to help prevent the formation of a conductive channel between adjacent transistors through which parasitic current can flow. Subsequent to the doping/implantation step, thick field oxide features are then grown. Isolation of adjacent active devices is achieved through a combination of the field oxide feature and the channel-stop region.

However, as the geometries of modem active devices decrease and are scaled with sub-micron or smaller design rules, it has been discovered that the basic LOCOS process has limitations that make application to the modern sub-micron geometries very difficult. For example, LOCOS cannot provide the necessary planarity for implementing multi-layer metallization schemes. This is because the uneven LOCOS surface produces a non-planar surface, which is then propagated through subsequent processes of metallization, inter-metal dielectric (IMD) formation, masking, via etching, and the like. As design rules become smaller and smaller, the consequences of the LOCOS uneven surface become more magnified.

Figure 3:
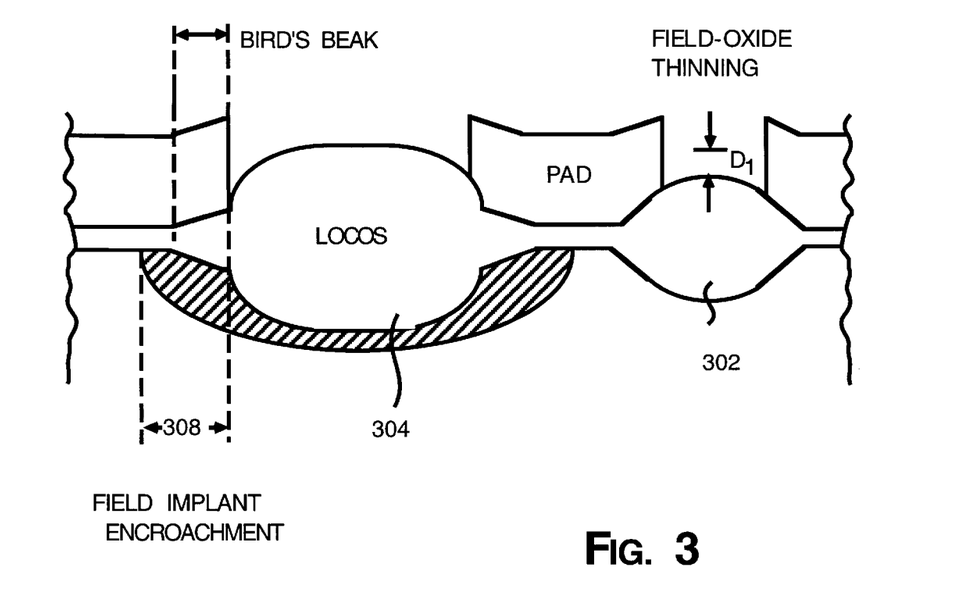
FIG. 3 schematically illustrates an isolation barrier formed by the prior art LOCOS process.

Further, the LOCOS process exhibits a "field-oxide thinning" effect. This is because the oxide does not grow as quickly in a smaller width spacing as it does in a wider spacing. By way of example, FIG. 3 schematically illustrates an isolation barrier formed by the basic LOCOS process. Because of field-oxide thinning, oxide region 302 is thinner than oxide region 304 by a thickness denoted as D1 in FIG. 3. Depending on the width of the spacings, these variations in the oxide thickness produce a more uneven surface than usual. These variations in the oxide thickness in turn lead to variations in the threshold voltage, interconnect-to-substrate capacitance, and field-edge leakage, or the like.

It has also been found that the LOCOS process causes some field oxide to grow laterally and penetrate under the nitride-mask region, creating what is referred to in the art as bird's beaks. Further, ions implanted in the channel-stop layer may diffuse laterally, increasing the effective size of the channel-stop region over the original implant dimensions. The encroaching ion implantation region is shown as region 308 in FIG. 3. As design rules become smaller and smaller, a larger fraction of the die area is effectively wasted to accommodate the limitations imposed by the LOCOS bird's beaks and ion implant encroachments.

Trench fill isolation represents an alternative technique for forming isolation barriers. In trench fill isolation, a thin layer of pad oxide is grown on the substrate, and a thin layer of silicon nitride is deposited over the pad oxide. The films are then masked and etched to produce trenches, using a conventional photoresist process. By way of example, one such photoresist technique involves the application of a resist material, the exposure of the resist in a contact or stepper lithography system, and the development of the resist to form a mask to facilitate subsequent etching.

Figure 4A:
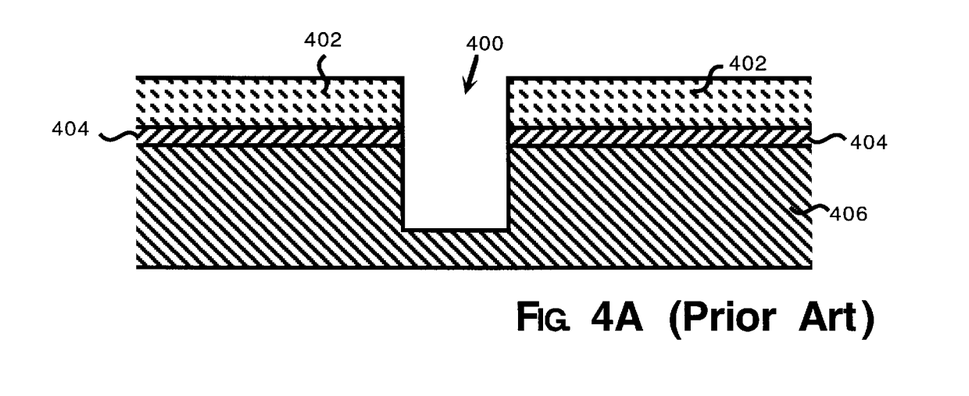
FIGS. 4A–4D schematically illustrate an isolation barrier formed by the prior art trench fill process.
Figure 4B:
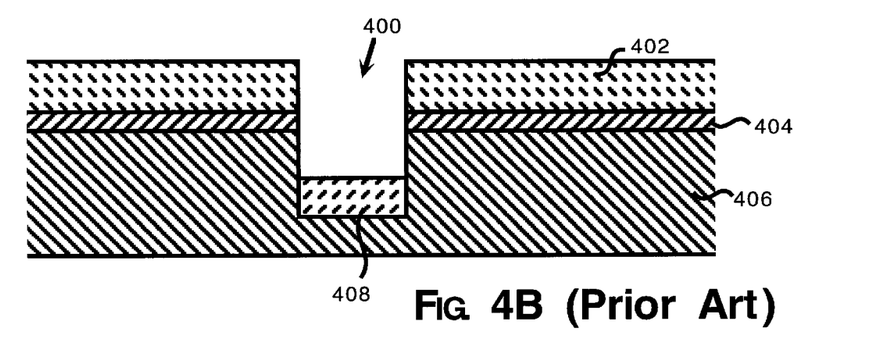

The result is shown in FIG. 4A, in which a trench 400 is etched through nitride layer 402 and pad oxide layer 404. Sometimes, ion implantation is used to produce a channel-stop layer in the substrate. This channel-stop layer is shown in FIG. 4B as channel-stop region 408.

Figure 4C:
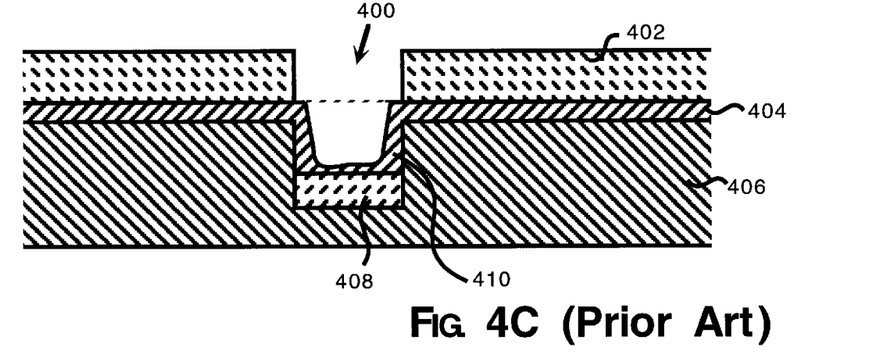

A thin layer of thermal oxide 410 is then grown in trench 400 (FIG. 4C). A chemical vapor deposition (CVD) process then fills trench 400 with oxide in FIG. 4D to provide the isolation. Subsequent chemical mechanical polish (CMP) planarizes the geometry, yielding tight tolerances that make subsequent processing steps easier. Trench-fill isolation proves to be an improvement over LOCOS as it has no bird's beaks, channel-stop ion diffusion, or field-oxide thinning effects. Hence, the die area can be used much more efficiently to achieve high device density.

Figure 4D:
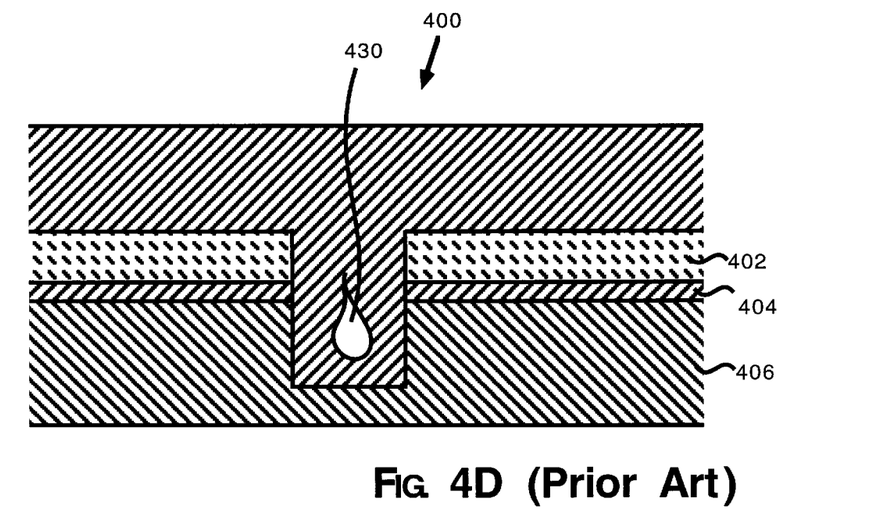

In the prior art, the trenches are typically filled using a plasma-enhanced chemical vapor deposition (PECVD) process. The prior art trench fill PECVD process is typically accomplished while the wafer is unbiased, resulting in a deposition of silicon dioxide that is fairly conformal. This conformal quality of the prior art trench-fill layer unfortunately often produces defects, which manifest themselves as voids or holes, in the filled trench. By way of example, FIG. 4D shows a void 430 in the filled trench, which is formed when trench-fill deposition pinches off the trench opening while filling it. Because of these defects, isolation barriers formed by the prior art trench fill deposition process have been found to be of low quality and unsuitable for modern narrow, deep trenches and high density devices.

In view of the above, what is needed is improved methods and apparatus for forming trench fill isolation barriers.

SUMMARY OF THE INVENTION

The invention relates, in one embodiment, to a method for filling a trench in a semiconductor wafer that is disposed in a plasma-enhanced chemical vapor deposition chamber. The method includes the step of depositing a protection layer of silicon dioxide over the wafer and into the trench while the wafer is biased at a first RF bias level. The protection layer has a thickness that is insufficient to completely fill the trench. Further, there is provided the step of forming a trench-fill layer of silicon dioxide over the protection layer and into the trench while the wafer is biased at a second RF bias level that is higher than the first bias level.

The protection layer is preferably sufficiently thick so as to prevent damage to layers underneath the protection layer during the step of forming the trench-fill layer. In one embodiment, at least a portion of the wafer is covered with silicon nitride prior to the above-mentioned step of depositing the protection layer.

In yet another embodiment, the invention relates to a method for manufacturing an integrated circuit, which includes the steps of providing a semiconductor wafer having a trench and filling that trench in a two-step process. The first step of the filling process involves the deposition of a protection layer of silicon dioxide over the wafer and into the trench while the wafer is biased at a first RF bias level with the protection layer having a thickness that is insufficient to completely fill the trench. The second step of the filling process involves forming a trench-fill layer of silicon dioxide over the protection layer and into the trench while the wafer is biased at a second RF bias level that is higher than the first bias level. There is further included the step of packaging a die of the wafer, thereby forming the integrated circuit that incorporates trenches filled by the inventive trench-filling technique.

These and other advantages of the present invention will become apparent upon reading the following detailed descriptions and studying the various figures of the drawings.

DETAILED DESCRIPTION OF THE PREFERRED EMBODIMENTS

FIG. 1 shows a portion of a representative MOS IC circuit to facilitate discussion of isolation structures in modern IC's. FIG. 2 shows an adjacent transistor pair, including isolation barriers to prevent the unwanted formation of parasitic transistors. FIG. 3 schematically illustrates an isolation barrier formed by the prior art LOCOS process. FIGS. 4A–4D schematically illustrate an isolation barrier formed by the prior art trench fill process.

Figure 5:
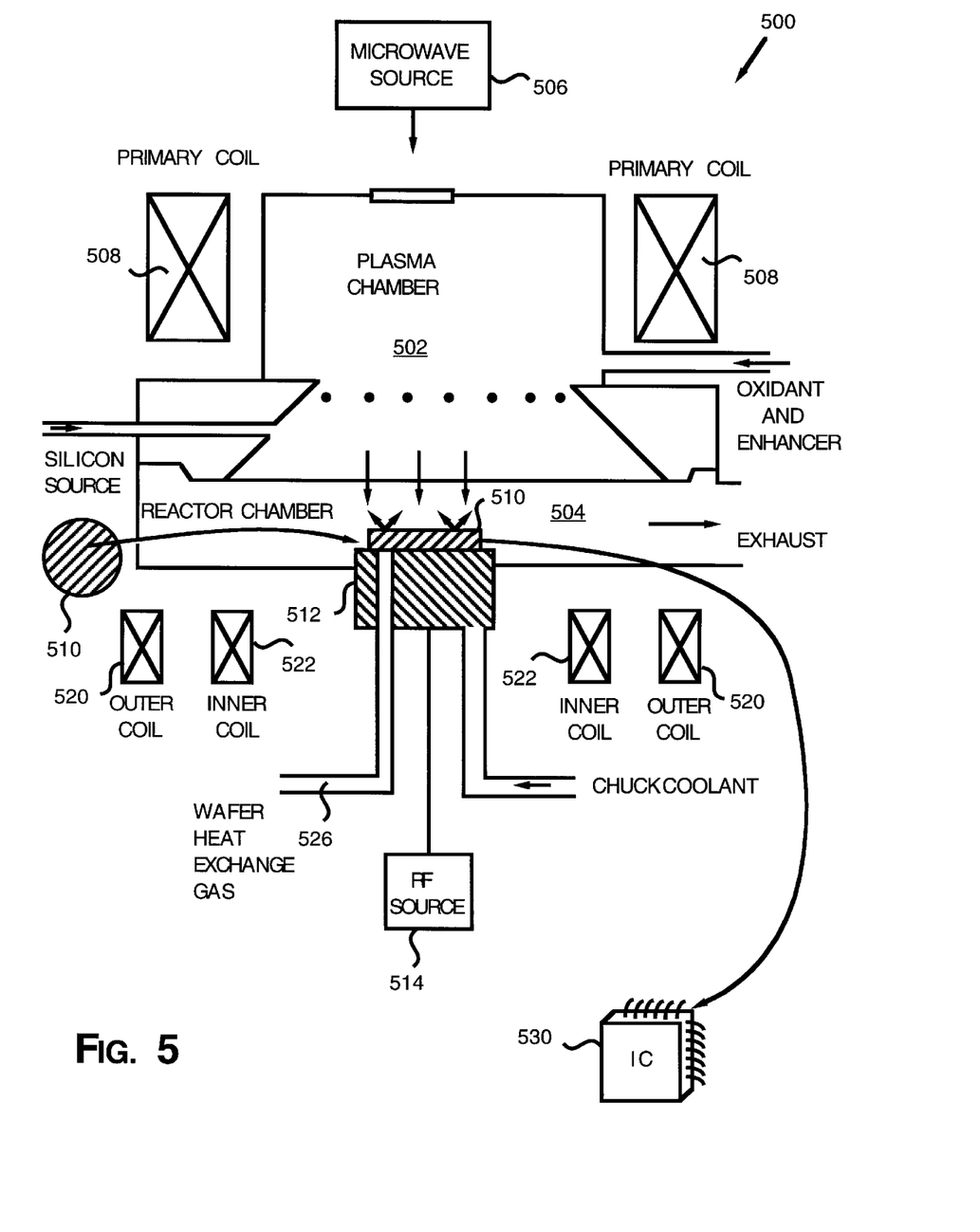
FIG. 5 is a schematic diagram of a chemical vapor deposition (CVD) system, representing one of the CVD systems suitable for implementing the inventive trench-fill process.

FIG. 5 is a schematic diagram of a chemical vapor deposition (CVD) system, representing one of the CVD systems suitable for implementing the inventive trench-fill process. Although other CVD systems may well be employed to practice the disclosed trench-fill technique, the CVD system of FIG. 5 represents, in the specific embodiment, an electron-cyclotron resonance (ECR) chemical vapor deposition system, such as the EPIC™ ECR CVD system available from Lam Research Corporation of Fremont, Calif.

In FIG. 5, a plasma processing device 500 comprises a plasma chamber 502 and a reactor chamber 504. Within reactor chamber 504, a silicon source such as silane is introduced. An oxidant, such as oxygen, and an optional inert enhancer comprising one of the noble gasses, such as argon, are introduced into plasma chamber 502. In the preferred embodiment, the argon and oxygen are energized by microwave energy from a microwave source 506 to generate, in cooperation with a primary coil 508, a high-density plasma of argon and oxygen. Outer coil 520 and inner coil 522 help modify the distribution of the magnetic flux, thereby shaping the flux lines to suit a particular process. The high-density plasma of argon and oxygen flows out of plasma chamber 502 into reactor chamber 504.

Within reactor chamber 504, a wafer 510 rests on an electrostatic (ESC) chuck 512. Wafer 510 represents a typical semiconductor wafer, e.g., a silicon wafer. Silane adheres to the surface of wafer 510 and is converted to silicon dioxide and hydrogen by the bombarding argon and oxygen ions from the plasma. A suitable wafer heat exchange gas, such as helium, is introduced to the underside of wafer 510 via a port 526 to maintain the temperature of wafer 510 at predefined levels during processing.

ESC chuck 512 is also coupled to a radio frequency (RF) source 514. In the specific embodiment of FIG. 5, RF source 514 represents a 13 MHz RF power source although other RF frequencies may also be suitable. When RF source 514 is turned off, the layer of silicon dioxide that is formed is fairly conformal. As mentioned earlier, a conformal layer, such as that deposited by the prior art trench-fill process, tends to pinch off the opening to the trench, leaving behind voids or holes as defects.

With RF source 514 on, a bias voltage is imparted to wafer 510 that accelerates the ions from the plasma down toward the surface of the wafer. Because of this, the layer of silicon dioxide that is formed is fairly anisotropic, i.e., it is not conformal, and can fill high-aspect ratio gaps well without defects. The presence of this RF bias voltage is one of the features that distinguish the plasma-enhanced sputter/CVD process from traditional chemical vapor deposition (CVD) processes. With this RF bias voltage, the film quality for gap-fill purposes is improved.

When RF energy is applied to chuck 512, however, the bombarding ions from the plasma tend to sputter material off wafer 510 during deposition. The net deposition rate is lower since sputtering occurs simultaneously with deposition. The difference between the deposition rate with RF power on and the deposition rate without RF power is defined herein as the sputter component. The etch-to-depth ratio is further defined herein as the ratio of the sputter component divided by the rate of deposition without the RF bias. In one embodiment, an etch-to-depth ratio of 35 percent enables narrow and deep trenches to be filled, e.g., 0.35 micron wide trenches in a 2:1 aspect ratio. The etch-to-depth ratio can be modified through the application of RF power to the chuck. For example, with no RF power applied, pure deposition with almost no sputtering results. Increasing the RF power increases the sputtering component, thereby lowering the net deposition rate (assuming other parameters stay unchanged).

Although the quality of the trench-fill is higher when RF power is applied to the wafer, the plasma-enhanced sputter/CVD step can cause damage to the wafer. For example, the sputter component that occurs when RF power is applied can damage the nitride diffusion barrier/chemical mechanical polish (CMP) stop layer, particularly during the initial stage of trench-fill deposition.

Figure 6:
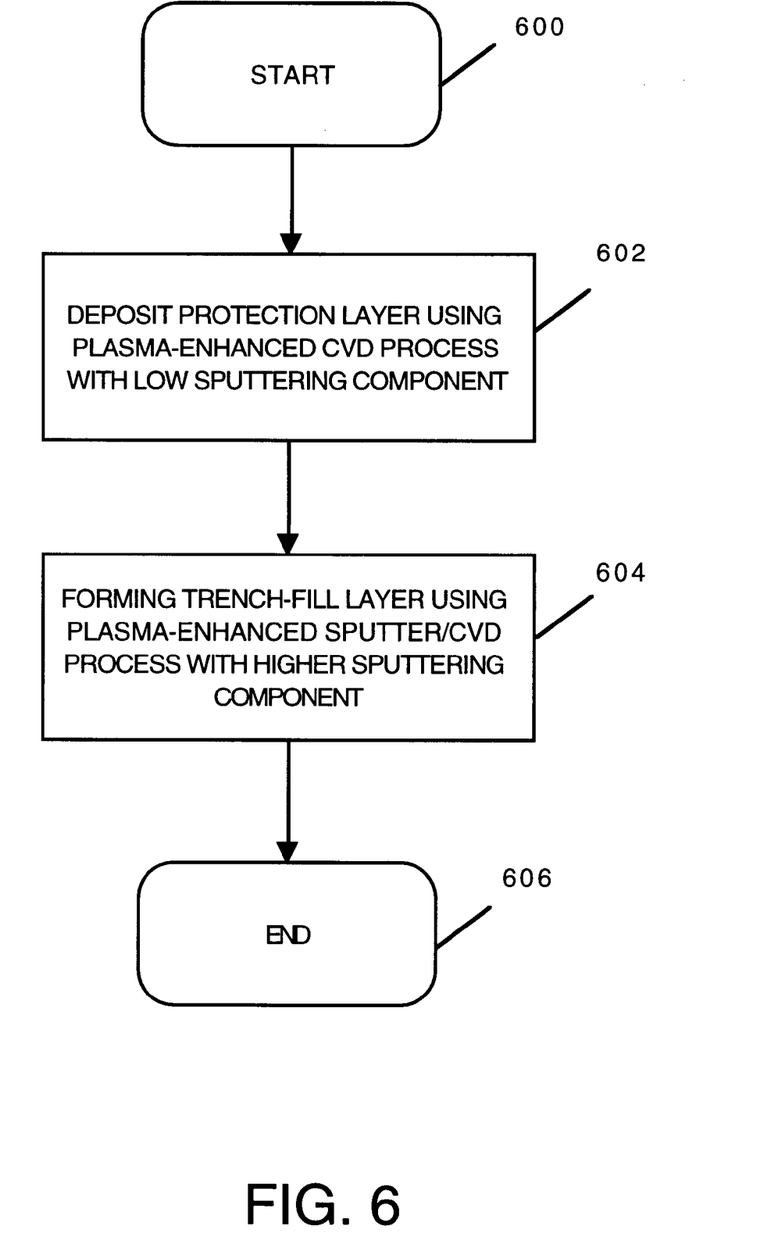
FIG. 6 is a flow chart illustrating the inventive trench-fill deposition process in accordance with one aspect of the present invention.

To provide a high quality trench-fill layer without damaging the wafer, the present invention performs trench-fill in two-steps. FIG. 6 is a flow chart illustrating the inventive trench-fill deposition process in accordance with one aspect of the present invention. Referring now to FIG. 6, the inventive process involves initially depositing, in step 602, a sacrificial or protection layer using the plasma-enhanced CVD process.

The protection layer is preferably deposited in step 602 with a low or no sputtering component, i.e., low or no RF power applied to the chuck. Because the sputter component is kept very low or non-existent, the layers underneath this protection layer is not significantly sputtered and is substantially intact during the deposition of the protection layer.

In step 604, RF power to the chuck is turned on to bias the wafer relative to the plasma, thereby causing ions to accelerate toward the wafer surface and sputter away some of the previously deposited protection material. The plasma-enhanced sputter/CVD step anisotropically fills the trench without defects by forming a high quality trench-fill layer on top of the previously deposited protection layer.

As the term is used herein, plasma-enhanced sputter/CVD (or simply sputter/CVD) denotes the process of simultaneously depositing and sputtering material. In accordance with the present invention, this sputter/CVD process produces the defect-free trench-fill layer. On the other hand, plasma-enhanced CVD (or simply PECVD) denotes the process of depositing material with little or no sputtering. The protection layer of the present invention is produced by this PECVD process.

While the trench is filled by the plasma-enhanced sputter/CVD process (with the higher sputtering component), the thin protection layer formed in step 602 typically gets partially sputtered away. However, the layers underneath the protection layer, e.g., silicon nitride, is advantageously substantially protected. In this manner, the protection layer formed in step 602 advantageously shields the layers underneath it from the sputtering effect of the plasma-enhanced sputter/CVD step, which fills the trench with the higher quality trench fill, e.g., silicon dioxide, film material.

In step 602, the thin protection layer is preferably formed as quickly as possible while still obtaining a quality silicon dioxide layer. In one embodiment, silicon dioxide is deposited in step 602, for a five-inch wafer, at the rate from about 500 angstroms per minute to about 4,500 angstroms per minute, more preferably from about 2,000 angstroms per minute to about 4,000 angstroms per minute, and most preferably at about 3,600 angstroms per minute..

In step 604, deposition is typically allowed to proceed at as fast a rate as possible while still obtaining a quality trench-fill, i.e., without defects such as voids or holes. In one embodiment, the trench-fill material is deposited in sputter/CVD step 604, for a five-inch wafer, at a rate from about 2,000 angstroms per minute to about 10,000 angstroms per minute, more preferably from about 3,600 angstroms per minute to about 5,000 angstroms per minute, and preferably at about 4,000 angstroms per minute.

For very deep or narrow trenches, e.g., those encountered in modern very high density devices, it may be desirable to reduce the deposition rate for one or both of steps 602 and 604 to levels that are even lower than the above-mentioned deposition rates. Although this produces high quality isolation barriers, the wafer throughput, i.e., the number of wafers processed per unit of time, is reduced since each wafer takes longer to have their trenches filled. For wider, shallower trenches, a faster deposition rate for one or both of steps 602 and 604 may suffice in producing an acceptable trench-fill. In this case, it is possible to increase the deposition rates to levels that are even higher than those previously mentioned and still achieve adequate isolation between adjacent active devices.

Figure 7:
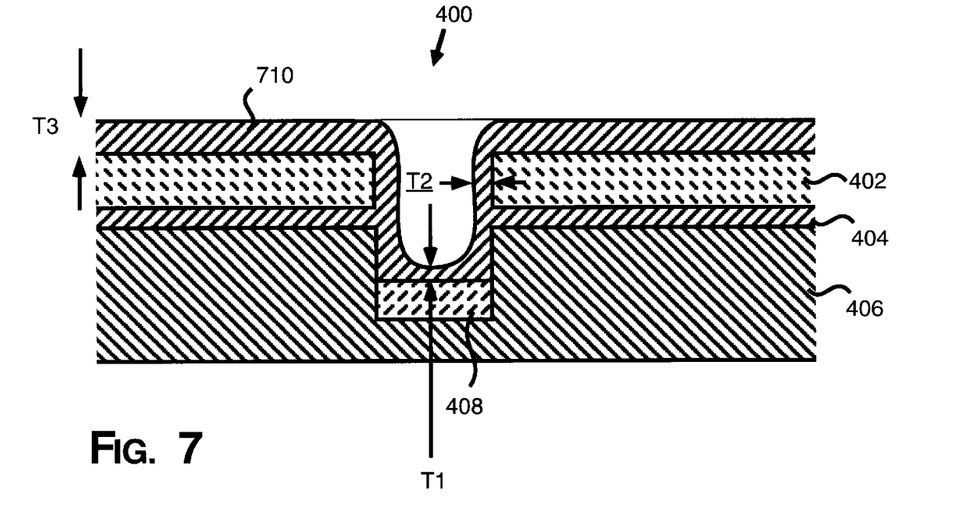
FIG. 7 shows the wafer of FIG. 4C after a thin protection layer is deposited.

FIG. 7 shows the wafer of FIG. 4C after a thin protection layer 710 is deposited. Note that although relatively shallow trenches are shown for ease of illustration, the method is particularly suitable for narrow, deep trenches. As mentioned in connection with step 602 of FIG. 6, this protection layer is deposited with a very low or no sputtering component and is consequently fairly conformal. Nevertheless, deposition tends to occur more rapidly on horizontal surfaces, such as on top of the wafer or along the bottom of the trench, than along the vertical sidewalls of the trench.

In one embodiment, the thickness of protection layer 710 along the top surface of the wafer, e.g., T3 in FIG. 7, is preferably from about 200 to about 2,000 angstroms, more preferably from about 500 to about 1,000 angstroms, and preferably at about 600 angstroms. In one embodiment, the thickness of the protection layer 710 along the bottom of trench 400 is about 80 percent of the value of T3. Along the sidewalls of trench 400, the thickness of this protection layer (T2 in FIG. 7), is, in one embodiment, about 30 percent of T3.

The protection layer formed in step 602 is preferably thick enough to substantially protect the layers underneath, e.g., silicon nitride layer 402, but is thin enough so that it does not completely fill the gap and possibly create voids or holes by pinching off the gap opening (as shown in FIG. 4D). Although the exact thickness of this protection/sacrificial layer varies for different geometries, process variables, and other parameters, this protection layer is, in one embodiment, only as thick as required to substantially protect the underlying layers. Given this disclosure, the exact thickness of this protection layer for a given geometry and process is apparent to those skilled in the art.

Figure 8A:
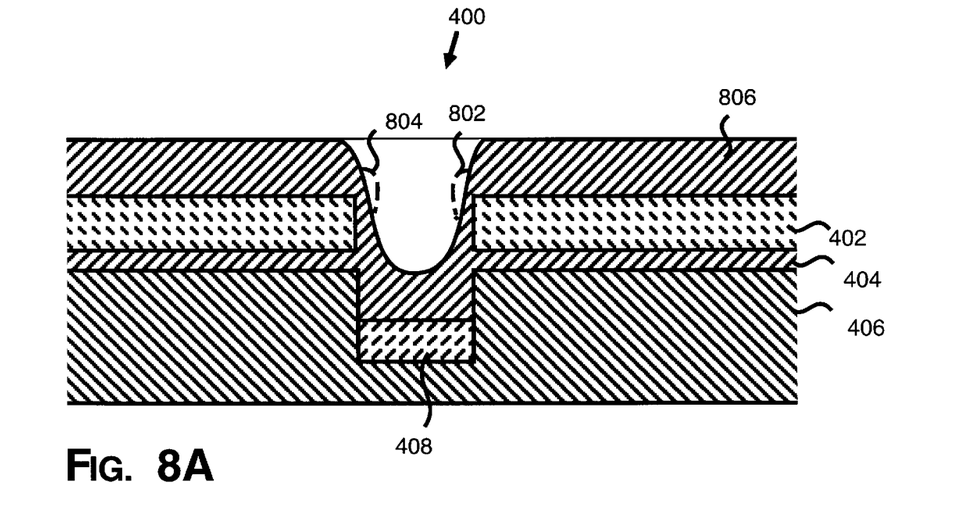
FIG. 8A illustrates the wafer of FIG. 7 during the plasma-enhanced sputter/CVD trench-fill step.

FIG. 8A illustrates the wafer of FIG. 7 during the trench-fill formation step, e.g., in the plasma-enhanced sputter/CVD step 604 of FIG. 6. After the protection layer 710 is deposited in FIG. 7, RF power to the chuck is turned on to bias the wafer relative to the plasma in the plasma processing chamber. As mentioned earlier, the effect of this is to introduce a sputter component into the CVD deposition process so that deposition and sputtering may occur simultaneously.

A portion of protection layer 710 is sputtered away during the initial stages of the sputter/CVD step 604. The portion of the protection layer 710 that are sputtered away during the high-RF power sputter/CVD step is illustrated in FIG. 8 as regions 802 and 804. The trench-fill layer 806, which is formed with the higher sputter component, is more anisotropic, thereby resulting in faster deposition along the bottom on trench 400 than along its vertical sidewalls. Consequently, the trench is less likely to be pinched off at its opening during deposition. Further, sputtering also prevents the deposition from "pinching off" the opening of trench 400, thereby helping to prevent the formation of defects in the trench-fill deposition during step 604.

Figure 8B:
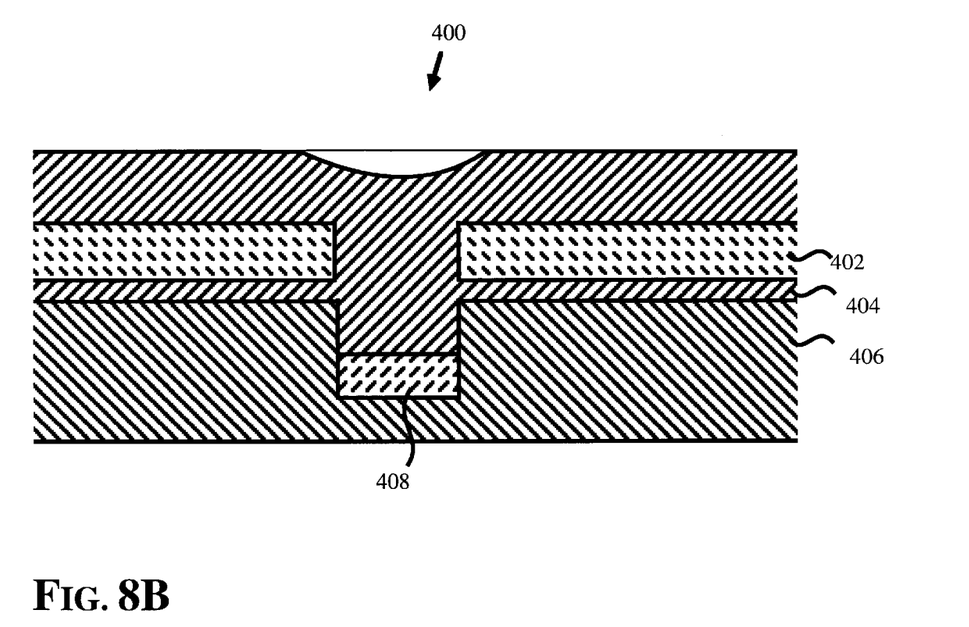
FIG. 8B illustrates a wafer trench that is completely filled by the anisotropic trench-fill material formed by simultaneously depositing and sputtering in accordance with the sputter/CVD step.

FIG. 8B shows trench 400 being completely filled by the anisotropic trench-fill material that is formed by simultaneously depositing and sputtering in accordance with sputter/CVD step 604 of FIG. 6.

It should be noted that the inventive trench fill process may advantageously be practiced in a conventional plasma-enhanced CVD system simply by biasing the wafer with an RF source after the protection layer is deposited. The introduction of the RF-induced bias advantageously results in the simultaneous sputtering and deposition of the silicon dioxide trench fill material. When deposited on top of a previously-deposited protection layer, this sputter/CVD step forms a high-quality isolation barrier without damaging the underlying substrate or leaving behind defects.

EXAMPLES

Example 1

Table 1 illustrates the parameter settings for filling trenches consisting of 0.25 micron lines and spaces, 0.6 micron deep with an effective aspect ratio of 2.4:1, and geometries consisting of 0.4 micron lines and spaces, 0.55 micron deep for an effective aspect ratio of 1.37:1.

In this example, the EPIC™ ECR CVD system available from the aforementioned Lam Research Corporation is used. It is desired in this example to deposit a silicon dioxide film about 5,000 angstroms thick, filling the trenches without voids or seams and without causing significant sputter damage to the 1,100 angstroms thick silicon nitride layer covering the features.

TABLE 1

|  | Protection Layer | Sputter/CVD trench-fill layer |
| --- | --- | --- |
| Time (sec) | 6 | 100 |
| RF bias (w) | 0 | 450 |
| Microwave (w) | 2400 | 2400 |
| Main coil (A) | 53 | 53 |
| Inner coil (A) | 20 | 20 |
| Outer coil (A) | 20 | 20 |
| ESC (volts) | −600 | −600 |
| Helium (torr) | 12 | 12 |
| Oxygen (sccm) | 47 | 47 |
| Argon (sccm) | 35 | 55 |
| Silane (sccm) | 30 | 40 |

As shown in Table 1, the protection layer deposition step lasts 6 seconds at an RF bias of zero watt. The parameters for the microwave, the main coil, inner coil, and outer coil for generating a plasma of oxygen and argon ions are shown. The electrostatic chuck on which the wafer rests is biased at −600 volts although mechanical chucks may well be employed. Helium cooling gas at 12 Torr is supplied to the backside of the wafer.

Oxygen is used as an oxidant although, as mentioned earlier, it is contemplated that other sources of oxygen to oxidize the silicon source material into silicon dioxide may well be employed. Argon is the optional inert enhancer to enhance the sputtering component and may be omitted in some embodiments. In other embodiments, other noble gasses such as neon, xenon, or the like, may well be employed in place of or in addition to argon.

Silane represents the silicon source material for forming the silicon dioxide film. It is contemplated that other silicon source materials such as disilane, SiF4, or any other silicon-bearing gasses may also be employed without departing from the scope and spirit of the present invention. The use of alternative oxidants, inert enhancers, and silicon source materials are well within the abilities of those skilled in the art.

During the sputter/CVD step, i.e., with RF power on, Table 1 shows that about 100 seconds are required. Other parameters stay substantially the same with the exception of argon and silane flows. Increasing the argon flow has the effect of increasing the sputtering component when RF power is applied to the chuck. On the other hand, increasing the silane has the effect of increasing the deposition rate of silicon dioxide to, e.g., offset the sputtering effect to maintain a high net deposition rate. During trench-fill, the temperature of the wafer is preferably, but not necessarily, kept at a temperature in the range of about 200° C. to about 700° C., more preferably from about 220° C. to about 400° C., and preferably at about 270° C.

It should be noted that the parameters of Table 1 are specific to 5-inch wafers in the EPIC™ ECR CVD system. As is known to those skilled in the art given this disclosure, these parameters may be modified for other systems or for wafers having different sizes or geometries.

Example 2

As a further example, Table 2 illustrates the parameter settings for filling in trenches in a 6-inch wafer using the aforementioned EPIC™ ECR CVD machine.

TABLE 2

| Step | 1 | 2 | 3 | 4 | 5 | 6 | 7 | 8 |
|---|---|---|---|---|---|---|---|---|
| Time(s) | 5 | 5 | 20 | 20 | 130 | 8 | 15 | 2 |
| RF (w) | 0 | 0 | 0 | 600 | 720 | 200 | 0 | 0 |
| Microwave (w) | 0 | 1600 | 1600 | 1600 | 1600 | 1500 | 1500 | 0 |
| Main coil (amp) | 58 | 58 | 58 | 58 | 58 | 58 | 58 | 58 |
| Inner coil (amp) | 23.3 | 23.3 | 23.3 | 23.3 | 23.3 | 23.3 | 23.3 | 23.3 |
| Outer coil (amp) | 32 | 32 | 32 | 32 | 32 | 32 | 32 | 32 |
| ESC (volts) | −400 | −400 | −400 | −400 | −500 | −200 | 0 | 0 |
| Helium (torr) | 0 | 0 | 0 | 0 | 4 | 0 | 0 | 0 |
| Oxygen (sccm) | 109 | 109 | 47 | 90 | 48 | 109 | 109 | 0 |
| Argon (sccm) | 130 | 130 | 35 | 0 | 65 | 140 | 140 | 0 |
| Silane (sccm) | 0 | 0 | 30 | 0 | 38 | 0 | 0 | 0 |

In steps 1 and 2, the reactor is stabilized. In step 3, the protection layer is formed. Note that RF power is at zero during the protection layer formation step 3. In order to create a suitable condition for the subsequent trench-fill step, the wafer is heated up using plasma heating in step 4. Note that although plasma heating is employed in this specific example to heat the wafer, it is contemplated that the wafer may be heated by other methods. In one embodiment, the wafer may be heated radiantly, e.g., in a preheat chamber, before being introduced into the plasma chamber for the subsequent sputter/CVD step. When plasma heating is not employed, less sputtering occurs during the heating step and the protection layer that is formed in step 3 can therefore be thinner without sacrificing protection of the underlying layers.

Step 5 represents the sputter/CVD step where the sputter component is increased to facilitate the formation of a high quality silicon dioxide trench-fill layer. Note that RF power is increased from zero in step 3 (protection layer deposition) to 720 watts in step 5 (sputter/CVD trench-fill formation). Also, the flow of silane, oxygen, and argon are all augmented to increase both the sputtering component and the deposition of the silicon dioxide during the sputter/CVD trench-fill formation step 5. In steps 6 and 7 of Table 2, the plasma is turned off. In step 8, the EPIC™ ECR CVD machine is shut down.

Figure 9:
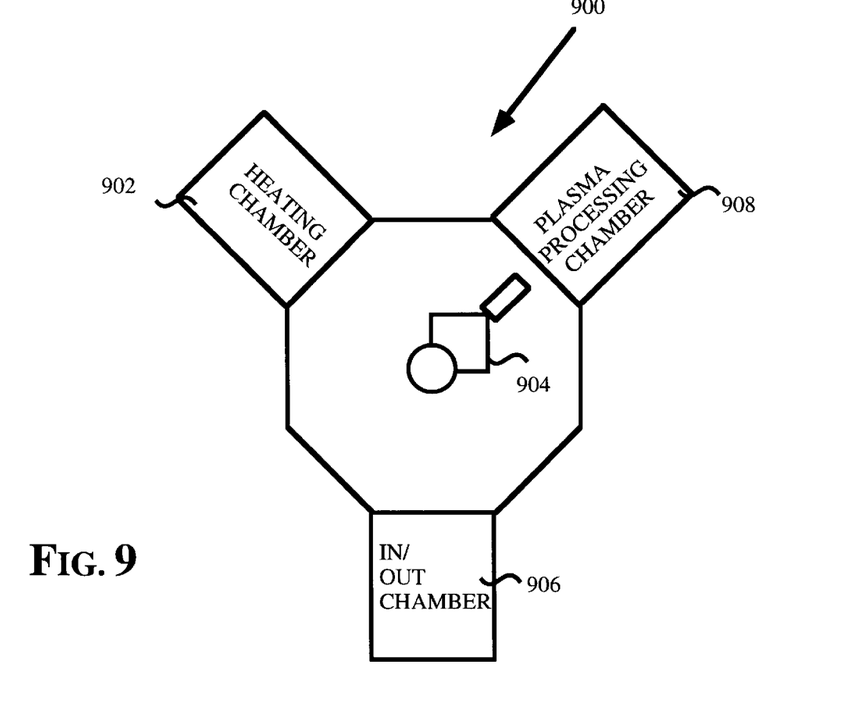
FIG. 9 illustrates, in accordance with yet another aspect of the present invention, a plasma-enhanced CVD system for maintaining wafer temperature at a desired level without employing plasma heating.

FIG. 9 illustrates, in accordance with yet another aspect of the present invention, a plasma-enhanced CVD system for maintaining wafer temperature at a desired level without employing plasma heating. As mentioned earlier, when the wafer is heated by methods other than plasma heating, no sputtering occurs during the heating step. Consequently, the protection layer of the present invention can advantageously be made thinner, without sacrificing protection of the underlying layers. Since the protection layer can be made thinner, the wafer throughput of the CVD system, i.e., the number of wafers the system can process per unit of time, is improved since less time must be spent in the protection layer deposition step.

In FIG. 9, a PECVD system 900 includes a heating chamber 902. Within heating chamber 902, the wafer may be heated using a conventional radiant and/or convection heating method. Wafers are introduced into and taken out of PECVD system 900 through an in/out wafer chamber 906.

A conventional dual arm loader 904 moves the wafers among in/out wafer chamber 906, a plasma processing chamber 908, and heating chamber 902 as required during wafer processing. For example, dual arm loader 904 may, after the protection layer is deposited, move the wafer from plasma processing chamber 908 to heating chamber 902 to heat it. When the wafer achieves the desired temperature, it may be moved by dual arm loader 904 into plasma processing chamber 908 for the subsequent sputter/CVD trench fill step.

The present invention is highly useful in the manufacturing of integrated circuit (IC) chips and the products incorporating IC chips. As illustrated in FIG. 5, after wafer 510 has been processed by the inventive trench-fill technique, it then undergoes additional conventional semiconductor processing steps and is packaged in a plurality of IC's 530.

Figure 10:
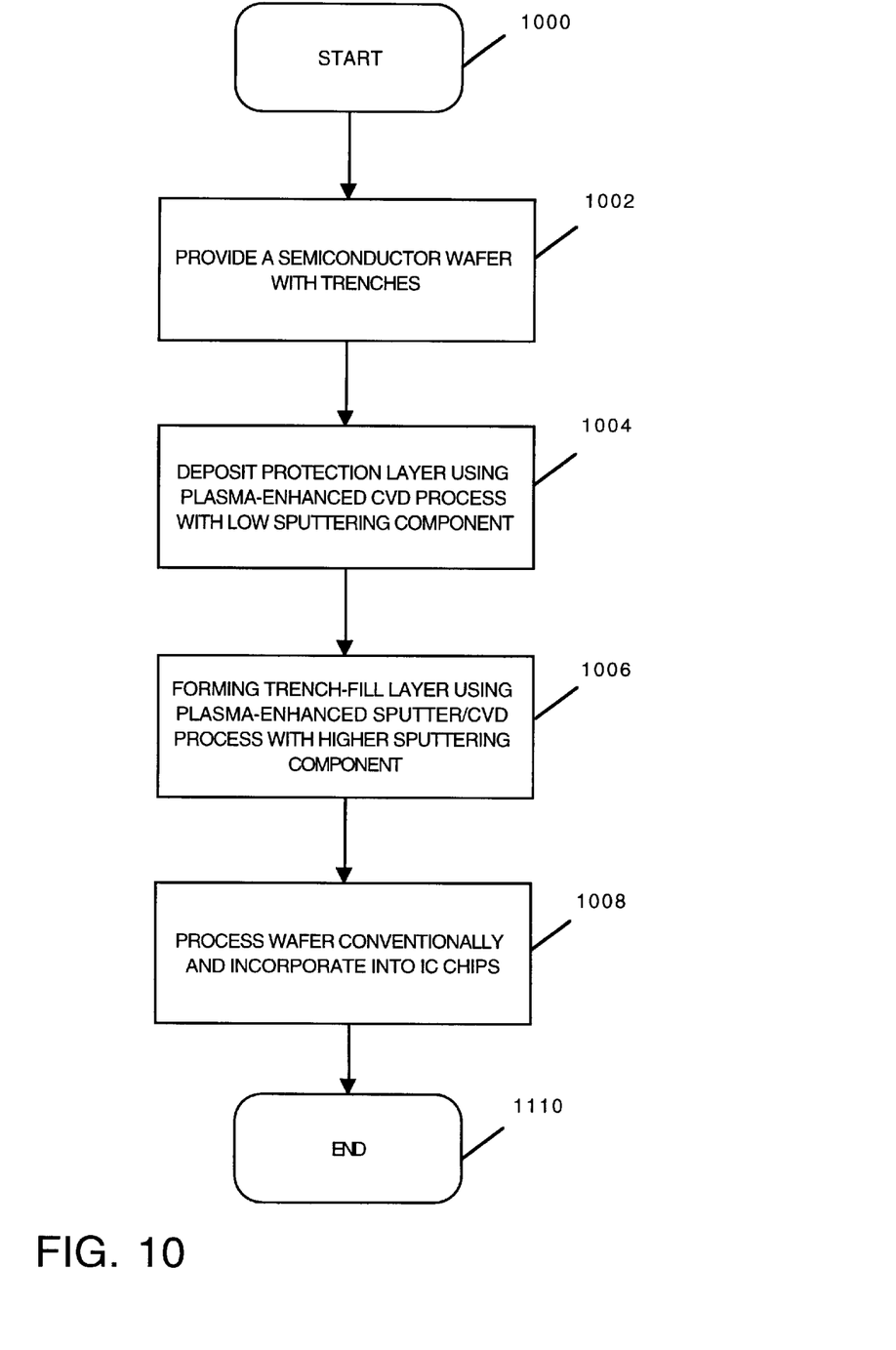
FIG. 10 shows, in accordance with one aspect of the present invention, a method for manufacturing IC chips employing the inventive trench fill process.

FIG. 10 shows, in accordance with one aspect of the present invention, a method for manufacturing IC chips employing the inventive trench fill process. In step 1002, a semiconductor wafer, such as a silicon wafer, having trenches formed therein is provided.

In step 1004, the protection layer is formed via the plasma-enhanced CVD process with a low or no sputtering component, e.g., little or no RF power. In step 1006, the trenches are filled via the plasma-enhanced sputter/CVD process with the higher sputtering component, e.g., with RF power on.

In step 1008, the wafer undergoes additional semiconductor processing steps of a conventional nature to be finished and incorporated into IC chips. The resulting IC chip may then be incorporated in an electronic device, e.g., any of the of well known commercial or consumer electronic devices. The ability of the inventive trench fill technique to fill small gaps of modern IC processes means that it is well suited to high speed electronic devices. Digital computers represent a class of such high speed electronic devices.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma-enhanced chemical vapor deposition chamber, a method for filling a trench of a semiconductor device, comprising:

depositing a protection layer of silicon dioxide over a wafer, said wafer being employed for fabricating said semiconductor device, and into said trench while said wafer is biased at a first RF bias level, said protection layer having a thickness that is insufficient to completely fill said trench; and depositing a trench-fill layer of silicon dioxide trench-fill material over said protection layer and into said trench while said wafer is biased at a second RF bias level that is higher than said first RF bias level to substantially fill said trench with said trench-fill material, wherein said protection layer is deposited at a first rate and said trench-fill layer is deposited at a second rate higher than said first rate, and wherein said second RF bias level causes sputtering, thereby causing said trench-fill material to be simultaneously sputtered and deposited over said protection layer and into said trench during said step of depositing said trench-fill layer.

2. The method of claim 1 wherein said protection layer is sufficiently thick so as to prevent damage to layers underneath said protection layer during said step of depositing said trench-fill layer.

3. The method of claim 1 wherein at least a portion of said wafer is covered with silicon nitride prior to said step of depositing said protection layer.

4. The method of claim 3 wherein said protection layer is sufficiently thick so as to prevent said silicon nitride layer from being damaged during said step of depositing said trench-fill layer.

5. The method of claim 1 further comprising the step of heating said wafer prior to said step of depositing said trench-fill layer.

6. The method of claim 5 wherein said heating step comprises the step of preheating said wafer radiantly in a chamber separate from said plasma processing chamber prior to said step of depositing said protection layer.

7. The method of claim 5 wherein said heating step comprises the step of preheating said wafer using convection heating in a chamber separate from said plasma processing chamber prior to said step of depositing said protection layer.

8. A method for manufacturing an integrated circuit, comprising:

providing a semiconductor wafer having a trench;

filling said trench by:

depositing a protection layer of silicon dioxide over a wafer, said wafer being employed for fabricating said semiconductor device, and into said trench while said wafer is biased at a first RF bias level, said protection layer having a thickness that is insufficient to completely fill said trench, and depositing a trench-fill layer of silicon dioxide trench-fill material over said protection layer and into said trench while said wafer is biased at a second RF bias level that is higher than said first RF bias level to substantially fill said trench with said trench fill material, wherein said protection layer is deposited at a first rate and said trench-fill layer is deposited at a second rate higher than said first rate and wherein said second RF bias level causes sputtering, thereby causing said trench-fill material to be simultaneously sputtered and deposited over said protection layer and into said trench during said step of depositing said trench-fill layer.

9. The method of claim 8 wherein said protection layer is sufficiently thick so as to prevent damage to layers underneath said protection layer during said step of depositing said trench-fill layer.

10. The method of claim 8 wherein at least a portion of said wafer is covered with silicon nitride prior to said step of depositing said protection layer.

11. The method of claim 10 wherein said protection layer is sufficiently thick so as to prevent said silicon nitride layer from being damaged during said step of depositing said trench-fill layer.

12. The method of claim 8 further comprising the step of heating said wafer prior to said step of depositing said trench-fill layer.

13. The method of claim 12 wherein said heating step comprises the step of preheating said wafer radiantly in a chamber separate from said plasma processing chamber prior to said step of depositing said protection layer.

14. The method of claim 12 wherein said heating step comprises the step of preheating said wafer using convection heating in a chamber separate from said plasma processing chamber prior to said step of depositing said protection layer.

15. A method for manufacturing an integrated circuit, comprising:

providing a semiconductor wafer having a trench;

filling said trench by:

depositing a protection layer of silicon dioxide over a wafer, said wafer being employed for fabricating said semiconductor device, and into said trench while said wafer is biased at a first RF bias level, said protection layer having a thickness that is insufficient to completely fill said trench, and depositing a trench-fill layer of silicon dioxide trench-fill material over said protection layer and into said trench while said wafer is biased at a second RF bias level that is higher than said first RF bias level to substantially fill said trench with said trench fill material, wherein said protection layer is deposited at a first rate and said trench-fill layer is deposited at a second rate higher than said first rate and wherein a flow rate of a silicon-bearing source gas during said depositing said protection layer step is lower than a flow rate of said silicon-bearing source gas during said depositing said trench-fill layer step to compensate for a sputtering action during said depositing said trench-fill layer step, thereby improving a trench fill rate during said depositing said trench-fill layer step.

16. A method for manufacturing an integrated circuit, comprising:

providing a semiconductor wafer having a trench;

filling said trench by:

depositing a protection layer of silicon dioxide over a wafer, said wafer being employed for fabricating said semiconductor device, and into said trench while said wafer is biased at a first RF bias level, said protection layer having a thickness that is insufficient to completely fill said trench, and depositing a trench-fill layer of silicon dioxide trench-fill material over said protection layer and into said trench while said wafer is biased at a second RF bias level that is higher than said first RF bias level to substantially fill said trench with said trench fill material, wherein said protection layer is deposited at a first rate and said trench-fill layer is deposited at a second rate higher than said first rate and wherein said trench is employed to electrically isolate adjacent transistors from one another.

17. In a plasma-enhanced chemical vapor deposition chamber, a method for filling a trench of a semiconductor device, comprising:

depositing a protection layer of silicon dioxide over a wafer, said wafer being employed for fabricating said semiconductor device, and into said trench while said wafer is biased at a first RF bias level, said protection layer having a thickness that is insufficient to completely fill said trench; and depositing a trench-fill layer of silicon dioxide trench-fill material over said protection layer and into said trench while said wafer is biased at a second RF bias level that is higher than said first RF bias level to substantially fill said trench with said trench-fill material, wherein said protection layer is deposited at a first rate and said trench-fill layer is deposited at a second rate higher than said first rate, a flow rate of a silicon-bearing source gas during said depositing said protection layer step is lower than a flow rate of said silicon-bearing source gas during said depositing said trench-fill layer step to compensate for a sputtering action during said depositing said trench-fill layer step, thereby improving a trench fill rate during said depositing said trench-fill layer step.

18. In a plasma-enhanced chemical vapor deposition chamber, a method for filling a trench of a semiconductor device, comprising:

depositing a protection layer of silicon dioxide over a wafer, said wafer being employed for fabricating said semiconductor device, and into said trench while said wafer is biased at a first RF bias level, said protection layer having a thickness that is insufficient to completely fill said trench; and depositing a trench-fill layer of silicon dioxide trench-fill material over said protection layer and into said trench while said wafer is biased at a second RF bias level that is higher than said first RF bias level to substantially fill said trench with said trench-fill material, wherein said protection layer is deposited at a first rate and said trench-fill layer is deposited at a second rate higher than said first rate, said trench is employed to electrically isolate adjacent transistors from one another.

* * * * *